United States Patent
Hsiao et al.

(10) Patent No.: US 7,891,536 B2
(45) Date of Patent: Feb. 22, 2011

(54) PVD TARGET WITH END OF SERVICE LIFE DETECTION CAPABILITY

(75) Inventors: Yi-Li Hsiao, Hsinchu (TW); Chen-Hua Yu, Hsin-Chu (TW); Jean Wang, Hsin Chu (TW); Lawrance Sheu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 565 days.

(21) Appl. No.: 11/427,618

(22) Filed: Jun. 29, 2006

(65) Prior Publication Data

US 2007/0068804 A1      Mar. 29, 2007

Related U.S. Application Data

(60) Provisional application No. 60/720,390, filed on Sep. 26, 2005, provisional application No. 60/728,724, filed on Oct. 20, 2005.

(51) Int. Cl.
*B21D 39/00* (2006.01)
(52) U.S. Cl. .............. 228/144; 204/298.03; 204/298.12
(58) Field of Classification Search ............ 204/298.12, 204/298.03; 228/144
See application file for complete search history.

(56) References Cited

U.S. PATENT DOCUMENTS

| | | | |
|---|---|---|---|
| 1,990,718 A * | 2/1935 | Swanstrom | ........... 470/19 |
| 4,324,631 A | 4/1982 | Meckel et al. | |
| 4,336,119 A | 6/1982 | Gillery | |
| 4,374,722 A | 2/1983 | Zega | |
| 4,545,882 A | 10/1985 | McKelvey | |
| 4,983,269 A | 1/1991 | Wegmann | |
| 5,380,419 A | 1/1995 | Eggers et al. | |
| 5,487,823 A | 1/1996 | Sawada et al. | |
| 6,503,380 B1 | 1/2003 | Buehler | |
| 6,638,402 B2 | 10/2003 | Marx et al. | |

(Continued)

FOREIGN PATENT DOCUMENTS

JP      63-169377      7/1988

(Continued)

OTHER PUBLICATIONS

Australian Patent Office—Search Report and Written Opinion Issued Mar. 11, 2009 regarding SG Patent Application No. SG 200605237-7 filed Aug. 3, 2006. AU.

(Continued)

*Primary Examiner*—Jessica L Ward
*Assistant Examiner*—Nicholas P D'Aniello
(74) *Attorney, Agent, or Firm*—Duane Morris LLP

(57) ABSTRACT

A PVD target structure for use in physical vapor deposition. The PVD target structure includes a consumable slab of source material and one or more detectors for indicating when the slab of source material is approaching or has been reduced to a given quantity representing a service lifetime endpoint of the target structure. Each detector includes an enclosure which may be made by forming a plurality of bores in a bulk material and separating the bulk material into a plurality of discrete enclosure units each including one of the bores. Alternatively, the enclosure of the detector may be made using a mold having one or more mold members and an extrusion, casting, electrical chemical plating, and/or sheet forming method.

12 Claims, 22 Drawing Sheets

U.S. PATENT DOCUMENTS

| | | |
|---|---|---|
| 6,797,079 B2 | 9/2004 | Nagano et al. |
| 6,797,362 B2 | 9/2004 | Parfeniuk et al. |
| 2002/0189632 A1* | 12/2002 | Glock et al. .................... 134/1 |
| 2004/0020769 A1 | 2/2004 | Ivannov et al. |
| 2004/0225384 A1 | 11/2004 | Onishi et al. |
| 2004/0262157 A1* | 12/2004 | Ford et al. ............. 204/298.12 |
| 2007/0068796 A1 | 3/2007 | Hsiao et al. |
| 2007/0068803 A1 | 3/2007 | Hsiao et al. |

FOREIGN PATENT DOCUMENTS

| | | |
|---|---|---|
| JP | 63169377 A | 7/1988 |
| JP | 03-504743 | 10/1991 |
| JP | H03-504743 A | 10/1991 |
| JP | 08176808 | 4/1993 |
| JP | 06306593 | 1/1994 |
| JP | 6041744 A | 2/1994 |
| JP | 06-088230 | 3/1994 |
| JP | 06-140383 A | 5/1994 |
| JP | 06-212416 A | 8/1994 |
| JP | 06-306593 | 11/1994 |
| JP | 07-054140 A | 2/1995 |
| JP | 07-292472 A | 11/1995 |
| JP | 08-176808 | 7/1996 |
| JP | H08-176808 A | 7/1996 |
| JP | 10025571 A | 1/1998 |
| JP | 63169377 A | 7/1998 |
| JP | 2004-299134 A | 10/2004 |
| TW | 573043 | 1/2004 |

OTHER PUBLICATIONS

Corresponding Singapore Application No. 0605239-3 Australian Patent Office Opinion and Search Report dated May 7, 2009.

Translated into English from corresponding Japanese Official action 2006-217327 dated Aug. 31, 2009.

Official action from corresponding Japanese Application No. 2006-217327.

CN Office Action dated Nov. 8, 2009. English translation of CN Office Action is included.

Notice of Reasons for Refusal issued on May 6, 2010 by the Japanese Patent Office.

English translation of the Notice of Reasons for Refusal issued on May 6, 2010 by the Japanese Patent Office.

Office Action issued on Nov. 9, 2009 by the Japanese Patent Office. English translation of the Office Action issued on Nov. 9, 2009 by the Japanese Patent Office.

Taiwanese Office Action dated Feb. 24, 2010.

Office Action dated Sep. 17, 2010 issued in co-pending application U.S. Appl. No. 11/427,602 filed on Jun. 29, 2006 of Yi-Li Hsiao.

Office Action dated Sep. 1, 2009 issued in co-pending U.S. Appl. No. 11/427,602 filed on Jun. 29, 2006 of Yi-Li Hsiao.

Office Action dated Mar. 30, 2009 issued in co-pending U.S. Appl. No. 11/427,602 filed on Jun. 29, 2006 of Yi-Li Hsiao.

Office Action dated Jun. 21, 2010 issued in co-pending U.S. Appl. No. 11/463,406 filed on Aug. 9, 2006 of Yi-Li Hsiao.

Office Action dated Dec. 23, 2009 issued in co-pending U.S. Appl. No. 11/463,406 filed on Aug. 9, 2006 of Yi-Li Hsiao.

Office Action dated Aug. 27, 2009 issued in co-pending U.S. Appl. No. 11/463,406 filed on Aug. 9, 2006 of Yi-Li Hsiao.

Office Action dated Mar. 16, 2009 issued in co-pending U.S. Appl. No. 11/463,406 filed on Aug. 9, 2006 of Yi-Li Hsiao.

CN Office Action dated Dec. 12, 2008.

CN Office Action dated Jul. 4, 2008.

TW Notice of Allowance dated Sep. 29, 1998 (U.S. calender date Sep. 29, 2009).

* cited by examiner

| Target material | Coated material |
|---|---|
| Ni | Pt, Co or Pd |
| Ni Pt alloy | Co or Pd |
| Ni Ti alloy | Co or Pd |
| Cobalt | Ti |
| Al | Cu or Si |
| Cu | Al or Si |
| Ti | Ni |
| Ta | Ta2O5, Ti |

FIG. 16

PVD TARGET WITH END OF SERVICE LIFE DETECTION CAPABILITY

RELATED APPLICATIONS

This application claims the benefit of U.S. Provisional Application No. 60/720,390, filed Sep. 26, 2005, and U.S. Provisional Application No. 60/728,724,filed Oct. 20, 2005, the entire disclosures of which are incorporated herein by reference.

FIELD OF THE INVENTION

The invention relates to physical vapor deposition (PVD). More particularly, the invention relates to PVD targets.

BACKGROUND OF THE INVENTION

Physical vapor deposition (PVD) is a well known process for depositing a thin film of material on a substrate and is commonly used in the fabrication of semiconductor devices. The PVD process is carried out at high vacuum in a chamber containing a substrate (e.g., wafer) and a solid source or slab of the material to be deposited on the substrate, i.e., a PVD target. In the PVD process, the PVD target is physically converted from a solid into a vapor. The vapor of the target material is transported from the PVD target to the substrate where it is condensed on the substrate as a thin film.

There are many methods for accomplishing PVD including evaporation, e-beam evaporation, plasma spray deposition, and sputtering. Presently, sputtering is the most frequently used method for accomplishing PVD. During sputtering, a gas plasma is created in the chamber and directed to the PVD target. The plasma physically dislodges or erodes (sputters) atoms or molecules from the reaction surface of the PVD target into a vapor of the target material, as a result of collision with high-energy particles (ions) of the plasma. The vapor of sputtered atoms or molecules of the target material is transported to the substrate through a region of reduced pressure and condenses on the substrate, forming the thin film of the target material.

PVD targets have finite service lifetimes. PVD target overuse, i.e., use beyond the PVD target's service lifetime, raises reliability and safety concerns. For example, PVD target overuse can result in perforation of the PVD target and system arcing. This, in turn, may result in significant production losses, PVD system or tool damage and safety problems.

The service lifetime of a PVD target is presently determined by tracking the accumulated energy, e.g., the number of kilowatt-hours (kw-hrs), consumed by the PVD system or processing tool. The accumulated energy method, however, takes time to master and the accuracy of this method depends solely on the hands-on experience of the technician. Even when mastered, the service lifetimes of the PVD targets are still less than they could be, as approximately 20-40 percent of the PVD target (depending upon the PVD target type) is wasted. This problem is depicted in FIG. 1, which is a graph plotting the erosion profile of a conventional PVD target comprising a consumable slab of source material. As can be seen, approximately 60 percent of the original quantity of the PVD target (target residue) remained after 1769 accumulated kw-hrs of operation of the PVD process system.

The low target utilization resulting from the PVD targets' abbreviated service lifetimes, creates high PVD target consumption costs. In fact, PVD target consumption cost is one of the most significant costs in semiconductor fabrication. Thus, if much of the wasted target material could be utilized, PVD target consumption costs could be substantially reduced. This, in turn, would significantly lower semiconductor fabrication costs and increase profitability.

The low target utilization also results in more frequent replacement of the PVD target and, therefore, more frequent maintenance of the PVD system or tool. Further, when the PVD target is replaced, time is needed to retune the PVD process for the new target.

Accordingly, there is a need for an improved PVD target.

SUMMARY

One embodiment is a method of manufacturing an enclosure of a detector that signals that a slab of consumable material is approaching or has been reduced to a predetermined quantity of the consumable material. The method comprises the steps of: providing a bulk material; forming a plurality of bores in the bulk material; and separating the bulk material into a plurality of discrete units each comprising one of the bores, wherein each of the units comprises the enclosure of the detector.

In another embodiment, the method comprises the steps of providing a first mold member having an outer surface of a predetermined shape; forming a layer of material about the outer surface of the first mold member; and separating the layer of material from the first mold member, wherein the layer of material comprises the enclosure.

In a further embodiment, the method comprises the steps of: providing a first mold member having an outer surface of a predetermined shape; forming a sheet of material about the outer surface of the first mold member; and bonding opposing edges of the sheet to one another.

BRIEF DESCRIPTION OF THE DRAWINGS

FIG. 16 shows a table which lists some exemplary detector layer materials that are suitable for use with some exemplary target materials.

DETAILED DESCRIPTION

Figure 1:
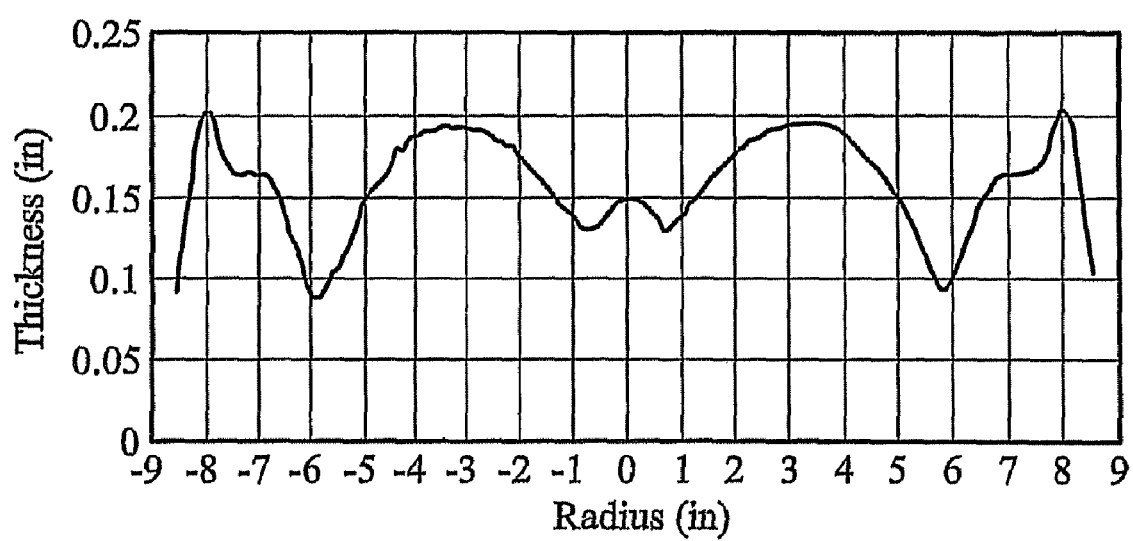
FIG. 1, which is graph plotting the erosion profile of a conventional PVD target structure comprising a slab of source material.
Figure 2A:
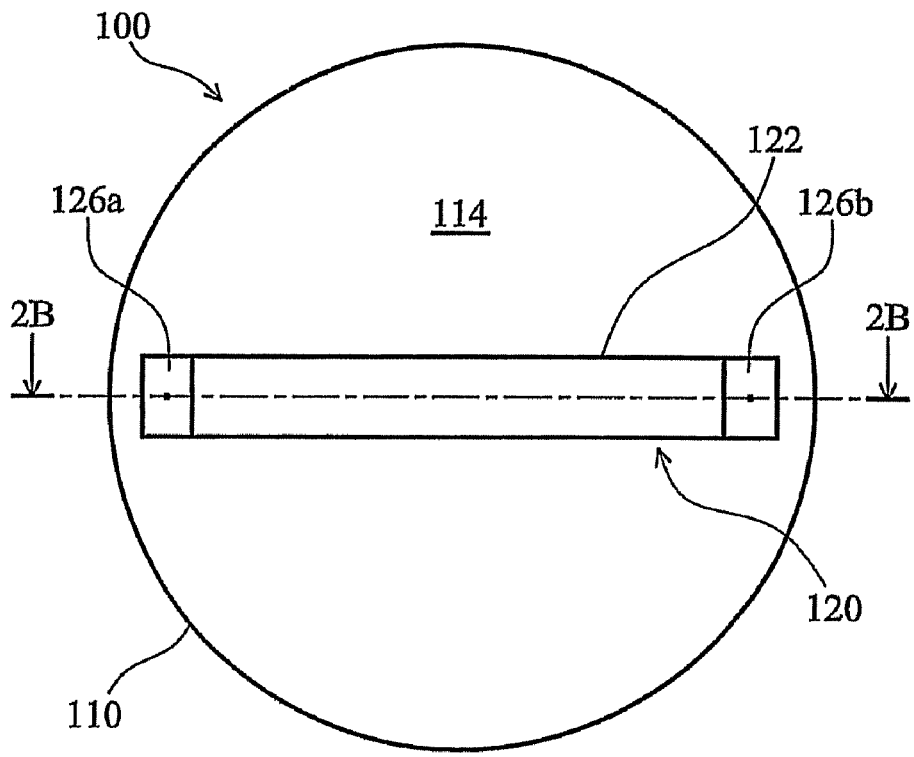
FIG. 2A is a base plan view illustrating an exemplary embodiment of a PVD target structure.
Figure 2B:
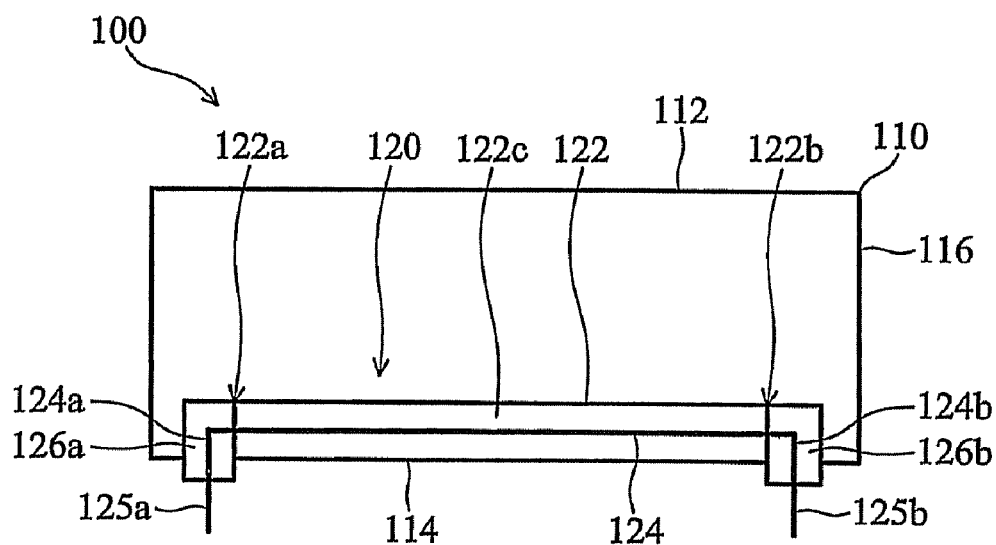
FIG. 2B is a cross-sectional view through line 2B-2B of FIG. 2A.

One embodiment is a physical vapor deposition (PVD) target structure having a service lifetime endpoint detector. FIG. 2A is a plan view illustrating an exemplary embodiment of a PVD target structure of the invention, denoted by numeral 100 and FIG. 2B is a cross-sectional view through line 2B-2B of FIG. 2A. The PVD target structure 100 comprises a consumable slab 110 of a desired source material (PVD target) and a filament detector 120, embedded in a base surface 114 of the PVD target 110.

The PVD target 110 comprises a reaction surface 112, the base surface 114 opposite the reaction surface 112, and a sidewall surface 116 extending between the reaction surface 112 with the base surface 114. The target 110 may be formed in any suitable and appropriate shape including, for example, circular, square, rectangular, oval, triangular, irregular, etc. The target 110 may be formed using any well known PVD target forming method. See for example U.S. Pat. No. 6,858, 102 entitled "Copper-Containing Sputtering Targets, And Methods Of Forming Copper-Containing Sputtering Targets."

The target 110, in one embodiment, may have a diameter (in the case of a circular target) of 18 inches and a thickness of 0.250 inches. In other embodiments, the target 110 may be formed to other suitable and appropriate dimensions. The target 110 may be composed of any suitable and appropriate source material including, for example, nickel (Ni), nickel platinum (Ni Pt) alloys, nickel titanium (Ni Ti) alloys, cobalt (Co), aluminum (Al), copper (Cu), titanium (Ti), tantalum (Ta), tungsten (W), indium tin oxide (ITO), zinc sulfide-silicon dioxide ($ZnS-SiO_2$) gold (Au), silver (Ag) and other noble metals.

The filament detector 120 comprises an enclosure formed by a tube 122 having opposing open ends 122a, 122b which are closed by isolators 126a, 126b. The isolators 126a, 126b hermitically seal the interior 122c of the tube 122 and suspend a filament 124 within the interior 122c of the tube 122. In one embodiment, the air within the interior 122c of the tube 122 may be evacuated therefrom to create a vacuum therein. In an alternative embodiment, the interior 122c of the tube 122 may be filled with an inert gas.

The filament 124 includes bent marginal end portions 124a, 124b which extend through the isolators 126a, 126b. The isolators 126a, 126b electrically isolated the bent marginal end portions 124a, 124b of the filament 124 from the tube 122 and the PVD target 110. The bent marginal end portions 124a, 124b of the filament 124 terminate externally to form filament terminals or leads 125a, 125b. The filament leads 125a, 125b allow connection of the filament 124 to a monitoring instrument, as will be described further on.

In one exemplary embodiment, the tube 122 may be composed of the same material as the PVD target 110. The diameter of the tube 122 should be sufficiently small and its location sufficiently close to the base surface 114 so that it is not penetrated until nearly all the target material 110 has been used. For example, in one exemplary embodiment, the tube 122 may have a diameter of about 0.5 mm.

The filament 124 is typically composed of the same material as the PVD target 110. In an alternative embodiment, the filament 124 may be composed of a material which is different from the material of the target 110 and does not affect the PVD processing result. The filament may have a diameter of about 0.2 mm in one exemplary embodiment.

The isolators 126a, 126b are made from an electrically isolating material or combination of materials. In one exemplary embodiment, the isolators 126a, 126b may be composed of a ceramic, such as alumina ($Al_2O_3$).

The filament detector 120 functions as a sensor for indicating when the PVD target 110 has been reduced to a quantity of material representing a service lifetime endpoint of the target 100 structure. Any usage of the PVD target structure 100 beyond this quantity (PVD target overuse) will likely result in perforation of the target 110 and system arcing, which in turn, may result in production loss, PVD system or tool damage and safety problems. The use of the filament detector 120 in the PVD target structure 100 maximizes the service lifetime of the target 110 and allows accurate, automated detection of when the PVD target structure 100 should be replaced to prevent the target related problems mentioned above.

The filament detector 120 is constructed to exhibit a characteristic or attribute that can be in-situ monitored by a monitoring device 330 (FIG. 5) connected to the filament 124 of the filament detector 120. In one embodiment, the characteristic or attribute of the filament 124 to be monitored may be the electrical resistance or impedance of the filament 124 and the monitoring device 330 may be an ohmmeter. Using the example where the characteristic or attribute is the electrical resistance or impedance of the filament 124, at the beginning of the PVD target structure's service lifetime in a PVD process chamber, the electrical resistance or impedance monitored by the monitoring device 330 will be some initial value. As the PVD target 110 erodes during PVD processing, the electrical resistance or impedance will remain at the initial value until the tube 122 is breached to expose the filament 124 suspended in the tube 122 to the PVD process, thus allowing the plasma (in the case of sputtering) to contact and erode the filament 124. When this occurs, the electrical resistance or impedance will change from the initial value, thereby indicating that the PVD target structure 100 is approaching the end of its useful life. At this point, the quantity of the target 110 remaining may be some predetermined percentage of the original quantity of the target 110. For example, in one embodiment, the quantity of the target 110 remaining when the filament 124 is first exposed may be approximately 0.5 percent of the original quantity of the target 110. As the target is further used in the PVD process chamber, the target 110 and the filament 124 will continue to be eroded until the filament 124 fractures. When this occurs, the electrical resistance or impedance will change again because the filament 124 becomes an open circuit, thereby indicating that the PVD target structure 100 has reached the end of its service lifetime. Using the previous example, the quantity of the target 110 remaining when the filament 124 fractures may be approximately 0.2 to 0.1 percent of the original quantity of the target 110. In response to the second change in electrical resistance or impedance, the operation of the PVD process system or tool may be halted manually by a technician, or halted automatically by a signal sent from the monitoring device 330 to the PVD process system or tool (or a controller that operates the tool).

Figure 3:
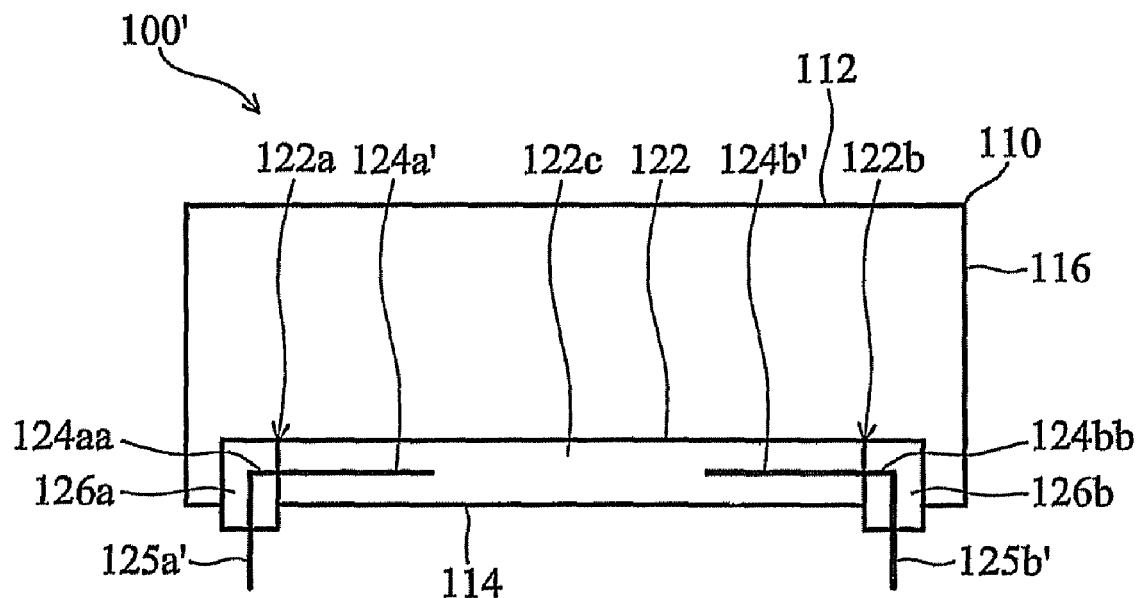
FIG. 3 is a cross-sectional view through illustrating another exemplary embodiment of a PVD target structure.
Figure 5:
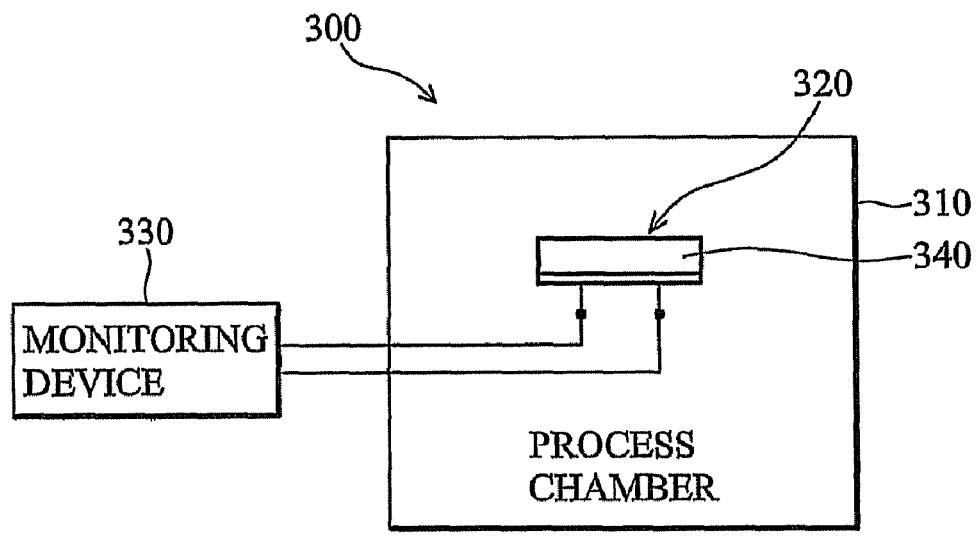
FIG. 5 is an exemplary embodiment of a system for detecting the service lifetime endpoint of a PVD target structure.

Referring now to FIG. 3, there is shown a cross-sectional view illustrating another exemplary embodiment of a PVD target structure, denoted by numeral 100'. The PVD target structure 100' comprises the earlier described consumable target 110 (composed of a desired source material) and an electrode detector 120', embedded in the base surface 114 of the target 110. The electrode detector 120' is similar to the filament detector 120 of the previous embodiment, except that the filament 124 is replaced by two separate, opposing electrodes 124a', 124b'. The electrodes 124a', 124b' include bent marginal end portions 124aa, 124bb which extend through the isolators 126a, 126b. The bent filament portions 124aa, 124bb terminate externally to form filament leads 125a', 125b'. The filament leads 125a', 125b' allow attachment of the electrodes 124a' 124b' to the earlier described monitoring device 330 (FIG. 5).

In operation, the electrodes 124a', 124b' of the electrode detector 120' will detect a current generated by ions in the plasma entering the tube 122 when the tube 122 of the detector 120' is breached. In this embodiment, the monitoring device or instrument connected to the electrodes 124a', 124b' may be a current measuring device or instrument.

Figure 4:
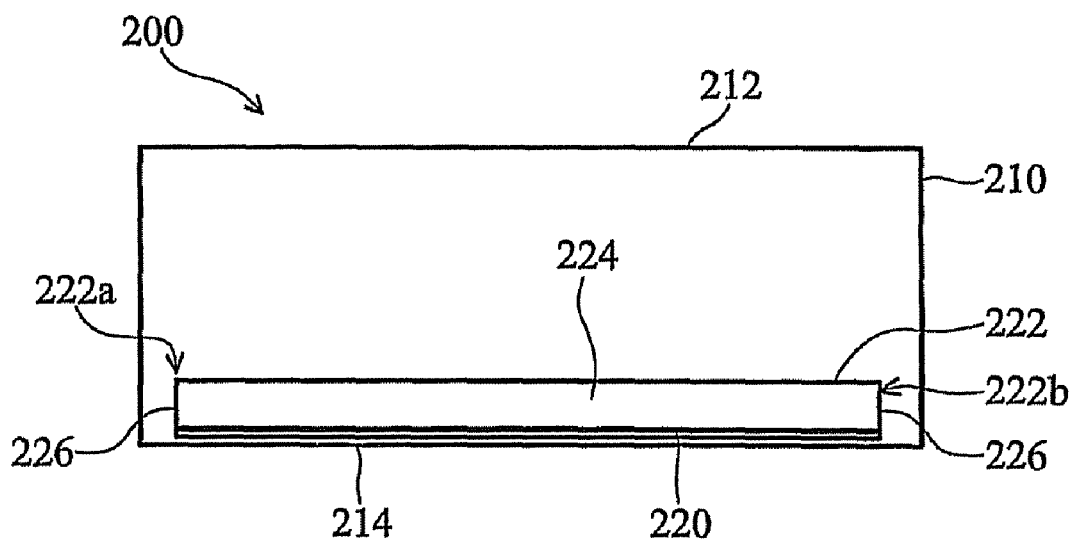
FIG. 4 is a cross-sectional view illustrating a further exemplary embodiment of a PVD target structure.

FIG. 4 is a cross-sectional view illustrating another embodiment of the PVD target structure, denoted by numeral 200. The PVD target structure 200 comprises a PVD target 210 composed of a desired source material, as in the previous embodiments, and an inert gas detector 220 embedded in the base surface 214 of the target 210.

The inert gas detector 220 comprises a tube 222 having opposing open ends 222a, 222b. The tube 222 may be similar or identical to the tube described in the embodiment shown in FIGS. 2A and 2B. The open ends 222a, 222b of the tube 222 are closed and hermetically sealed by closures 226, such as plugs made from the same material as the tube 222 or any other suitable material. The tube 222 is filled with an inert gas 224, such as helium (He), which does not affect the PVD processing result.

Figure 6:
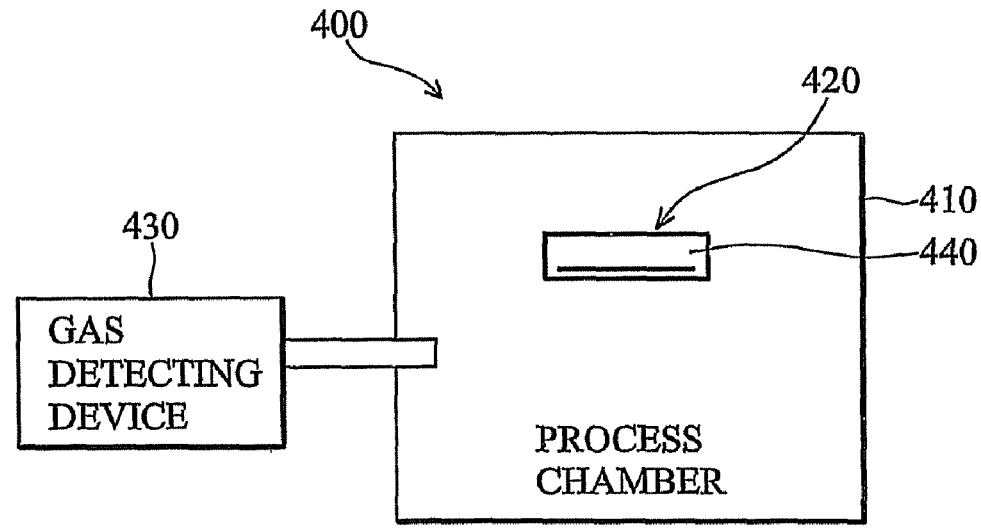
FIG. 6 is another exemplary embodiment of a system for detecting the service lifetime endpoint of a PVD target structure.

During PVD processing, the target 200 is in-situ monitored for emission of the inert gas 224 by a gas detection device 430 (FIG. 6). As the PVD target 210 erodes during PVD processing, the inert gas 224 remains undisturbed in the tube 222, until the tube 222 is breached by PVD process forces, e.g., the sputtering plasma. Once this occurs, the inert gas 224 filling the tube 222 is emitted and may be detected by the gas detection device 420. The gas detection device 430 may be by optical emission spectroscopy (OES), residual gas analysis (RGA), or other suitable detection method. In one exemplary embodiment, the inert gas detector 220 allows the target 210 of the PVD target structure 200 to be reduced to a quantity less than 0.5 percent of its original quantity.

Thus, the inert gas detector 220 operates as a sensor to indicate when the target 210 of target structure 200 has been reduced to a quantity representing a service lifetime endpoint of the target structure 200.

In another exemplary embodiment, the inert gas filling the tube 222 of the gas detector 220 may be replaced by another substance that does not affect the PVD processing result. The substance may be a solid or a liquid that is capable of evaporating when exposed to the PVD process, to enable detection of the substance thereafter. The solid substance may be powered material listed in the "coated material" column of the table shown in FIG. 16 which lists some exemplary materials that will not effect the PVD processing result of respective exemplary target materials listed in the "target material" column of the FIG. 16 table. The liquid substance may be an inert gas (e.g., helium) in liquid form that may be injected into the tube. When filled with a liquid substance, the tube may have a diameter as small as 0.03 mm.

Figure 7A:
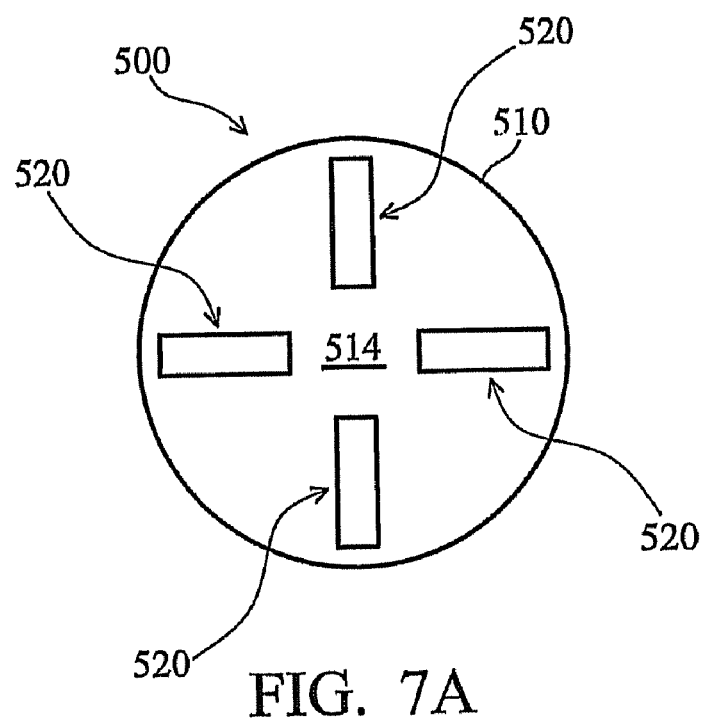
FIGS. 7A and 7B are base plan views of PVD targets having plural tube-based detectors.
Figure 7B:
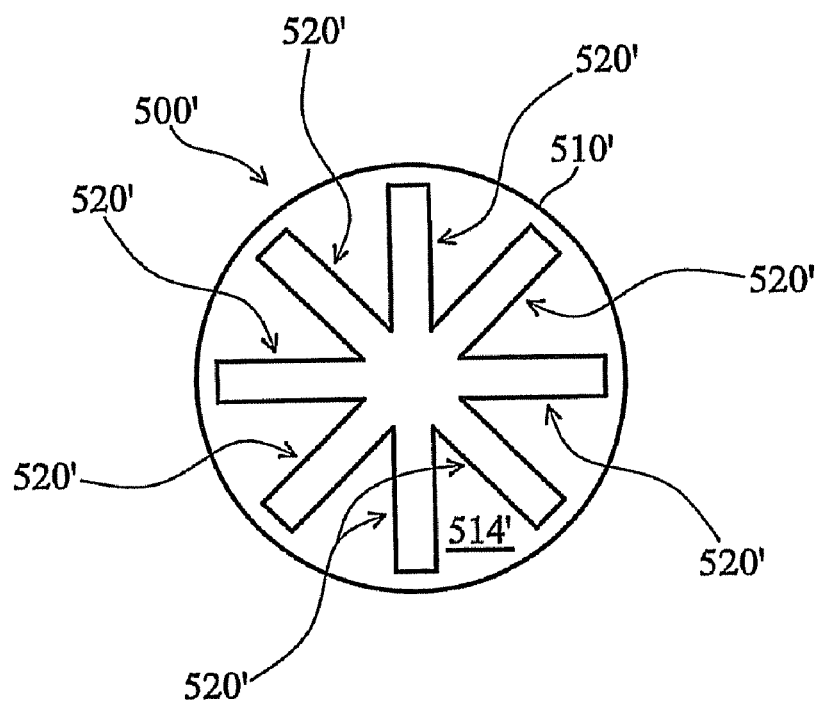

The PVD target structures 100, 100', 200 described above comprise a single tube-based detector 120, 120' 220. In other exemplary embodiments, the target structure may comprise multiple tube-based detectors distributed across the PVD target, preferably in the more erosive positions of the target (e.g., FIG. 7A). Distributing multiple tube-based detectors across the target increases detection uniformity and allows detection of localized target erosion. FIGS. 7A and 7B, illustrate two exemplary embodiments of a PVD target structure 500, 500' comprising two or more, tube-based detectors 520, 520' (each having, for example, a length of 4 cm or less) distributed across the base surface 514, 514' of the PVD target 510, 510' and embedded therein. As shown in FIG. 7A, the tube-based detectors 520 may be distributed radially across the target slab 510 and separate from one another. As shown in FIG. 7B, the tube-based detectors 520' may be distributed radially across the target 510' and such that they converge with one another at the center of the target 510'.

Figure 8A:
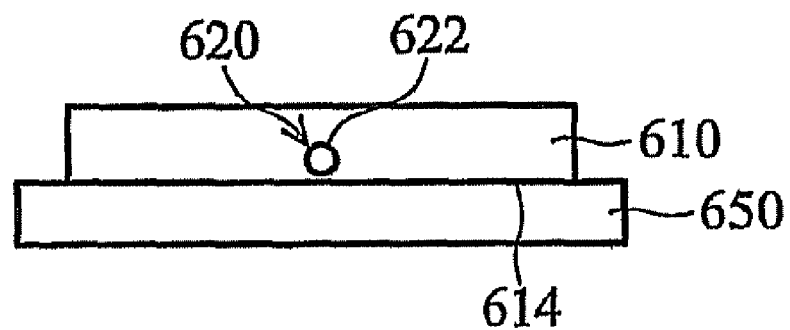
FIGS. 8A and 8B are cross-sectional views showing two exemplary locations where the tube may be embedded in the base surface of the target.
Figure 8B:
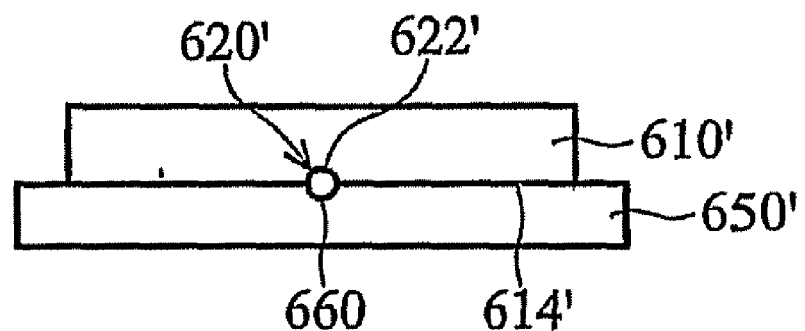
Figure 8C:
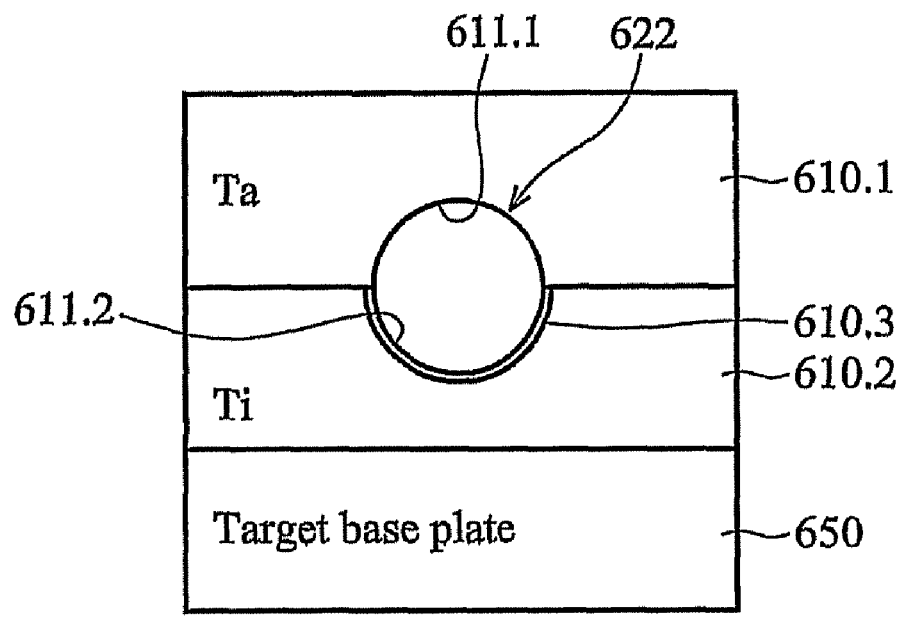
FIG. 8C is a cross-sectional view illustrating an exemplary method for embedding the tube shown in the location depicted in FIG. 8A.
Figure 8D:
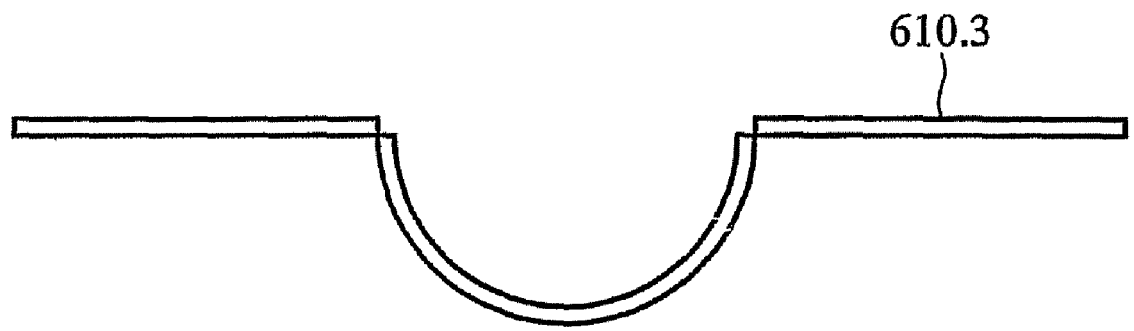
FIG. 8D is an elevational view illustrating the thin foil depicted in FIG. 8C.

In some exemplary embodiments, the tube-based detectors 620 may be embedded in the base surface 614 of the PVD target 610 so that the tube 622 is flush with or slightly recessed from the base surface 614 of the target 610 (as well as the target base plate 650, which may be made of a copper (Cu) alloy, such as Cu—Zn or any other suitable material), as shown in FIG. 8A. This may be accomplished in one embodiment, as shown in FIG. 8C, by forming the PVD target 610 as a source material member 610.1 made of the desired source material (e.g., tantalum) and an interface member 610.2 made of an interface material (e.g., titanium). The abutting surfaces of the source material and interface members 610.1 and 610.2 may be provided with corresponding tube receiving grooves 611.1 and 611.2 which are sized and shaped to receive a portion of the tube 622. The tube 622 is placed in the tube receiving grooves 611.1 and 611.2 and the source material and interface target members 610.1 and 610.2, the tube 622 and the target base plate 650 are bonded to one another using a hot press bonding process performed at a pressure and temperature sufficient to cause the source material and interface members 610.1 and 610.2, the tube 622 and the target base plate 650 to physically bond to one another. Specifically, the pressure and temperature depends upon the material of the base plate, the source material of the target, and the bonding time. In the example used above (e.g., copper base plate and tantalum source material), the temperature and pressure used may be about 400° C. (slightly over ⅓ of the melting temperature of copper which is 1083° C.) and about 13,000 psi, respectively. In some embodiments, a thin foil 610.3 made of the source material may be disposed in the tube receiving groove 611.2 of the interface member 610.2. The foil 610.3, shown by itself in FIG. 8D, may be used as a barrier layer to prevent atoms of the interface member 610.2 from migrating into the area of the groove 611.2 of the tube 622 and the source material 610.1. In other embodiments, the tube-based detectors 620' may be at least partially embedded in the base surface 614' of the target 610' so that the top of the tube 622' is slightly above the base surface 614' of the target 610, as shown in FIG. 8B. The target base plate 650' in this embodiment may include a recess 660 for receiving the portion of the tube 622 that protrudes from the base surface 614' of the target 610', so that the base surface 614' of the target 610 may lie flush on the target base plate 650'.

Figure 9A:
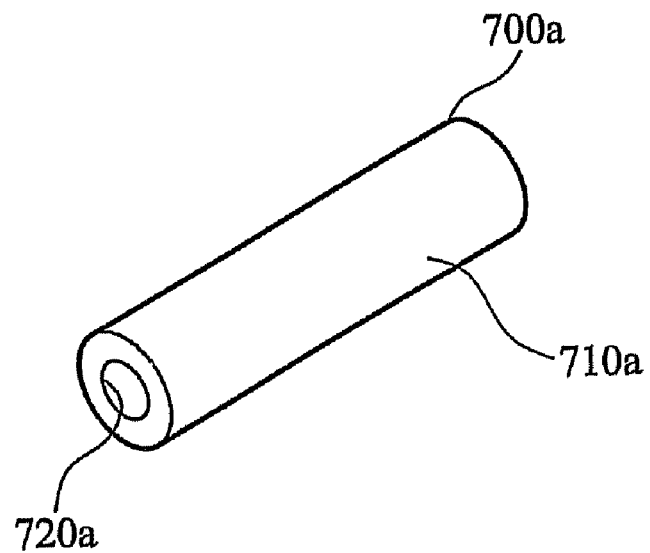
FIGS. 9A-9F are perspective views showing various exemplary embodiments of the tube of the tube-based detectors.
Figure 9B:
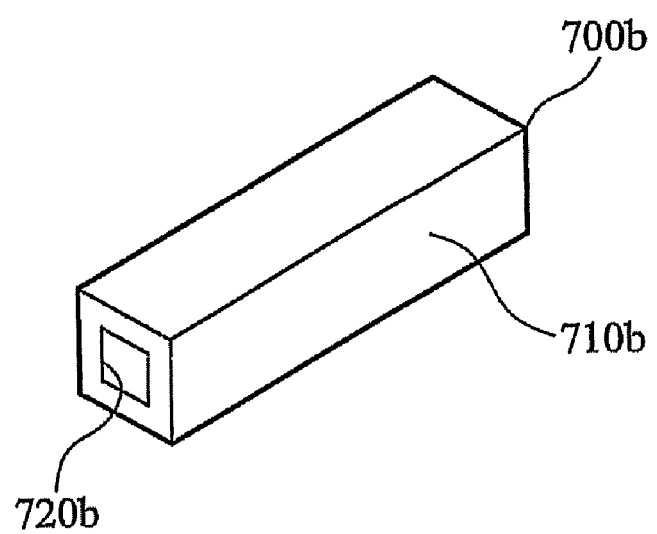
Figure 9C:
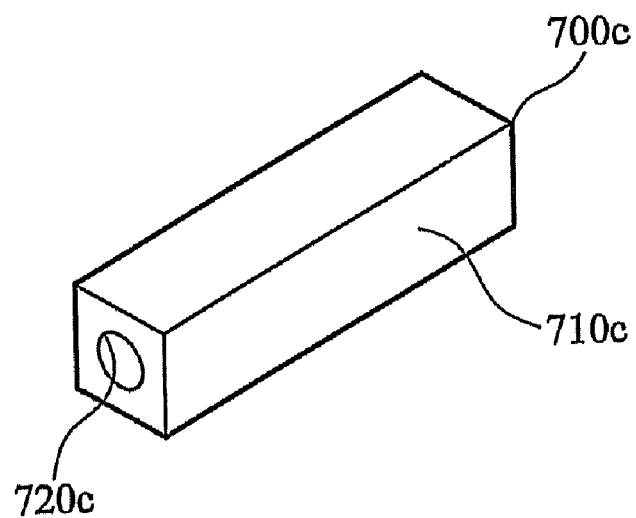
Figure 9D:
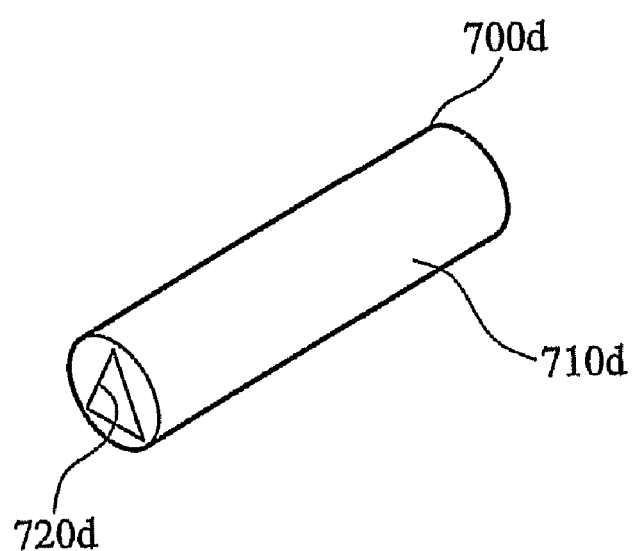
Figure 9E:
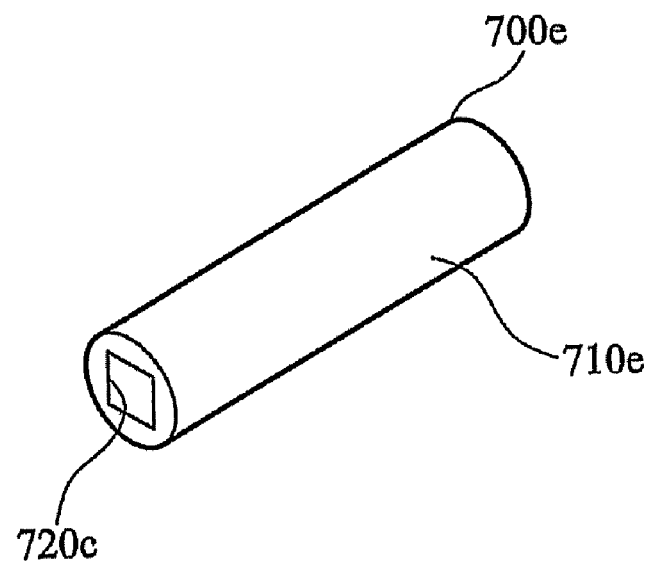
Figure 9F:
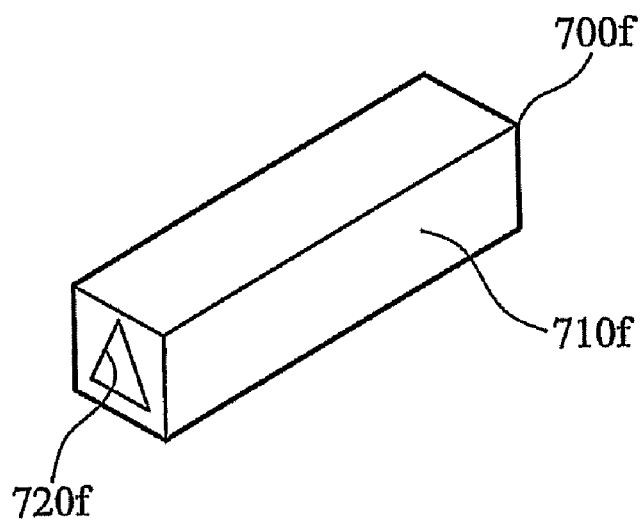

The tube(s) of the tube-based detectors may be constructed in any suitable and appropriate shape. The tube may have outer and inner surfaces that have identical or different cross-sectional shapes. FIGS. 9A-9F are perspective views showing some exemplary embodiments of the tubes. FIG. 9A show a tube 700a having outer and inner surfaces 710a, 720a with circular cross-sectional shapes. FIG. 9B shows a tube 700b having outer and inner surfaces 710b, 720b with diamond cross-sectional shapes. FIG. 9C shows a tube 700c having an outer surface 710c with a square cross-sectional shape and an inner surface 720c with a circular cross-sectional shape. FIG. 9D shows a tube 700d having an outer surface 710d with a circular cross-sectional shape and an inner surface 720d with a triangular cross-sectional shape. FIG. 9E show a tube 700e having an outer surface 710e with a circular cross-sectional shape and an inner surface 720e with a square cross-sectional shape. FIG. 9F shows a tube 700f having outer and inner surfaces 710f, 720f with square cross-sectional shapes. The outer and inner surfaces of the tube(s) may have other cross-sectional shapes including rectangular and oval, to name a few.

Figure 14:
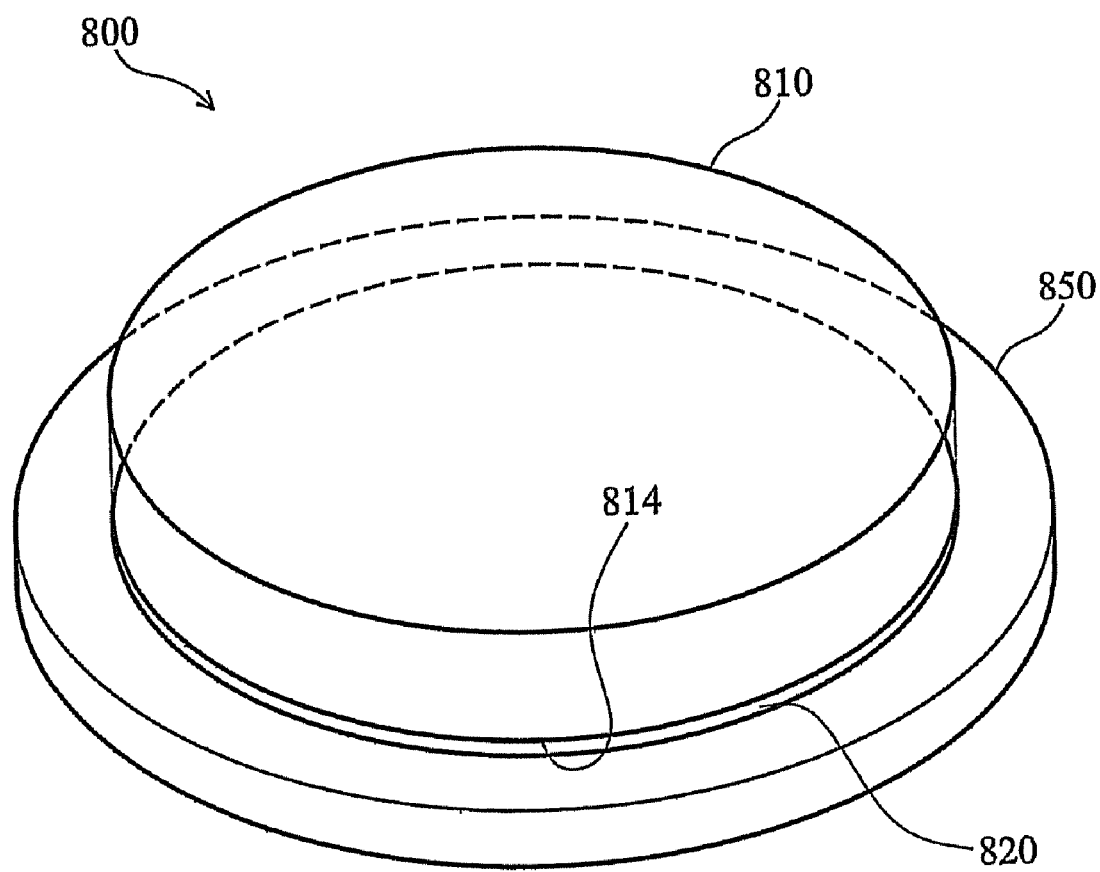
FIG. 14 is a perspective view illustrating yet another exemplary embodiment of a PVD target structure.

Referring now to FIG. 14, there is shown a perspective view illustrating yet another exemplary embodiment of a PVD target structure, denoted by numeral 800. The PVD target structure 800 comprises the above described consumable PVD target 810 (composed of a desired source material) and a detector layer 820, disposed adjacent the base surface 814 of the target 810. In the embodiment of FIG. 14, the detector layer 820 may couple the PVD target structure 800 to a base plate 850.

Figure 15:
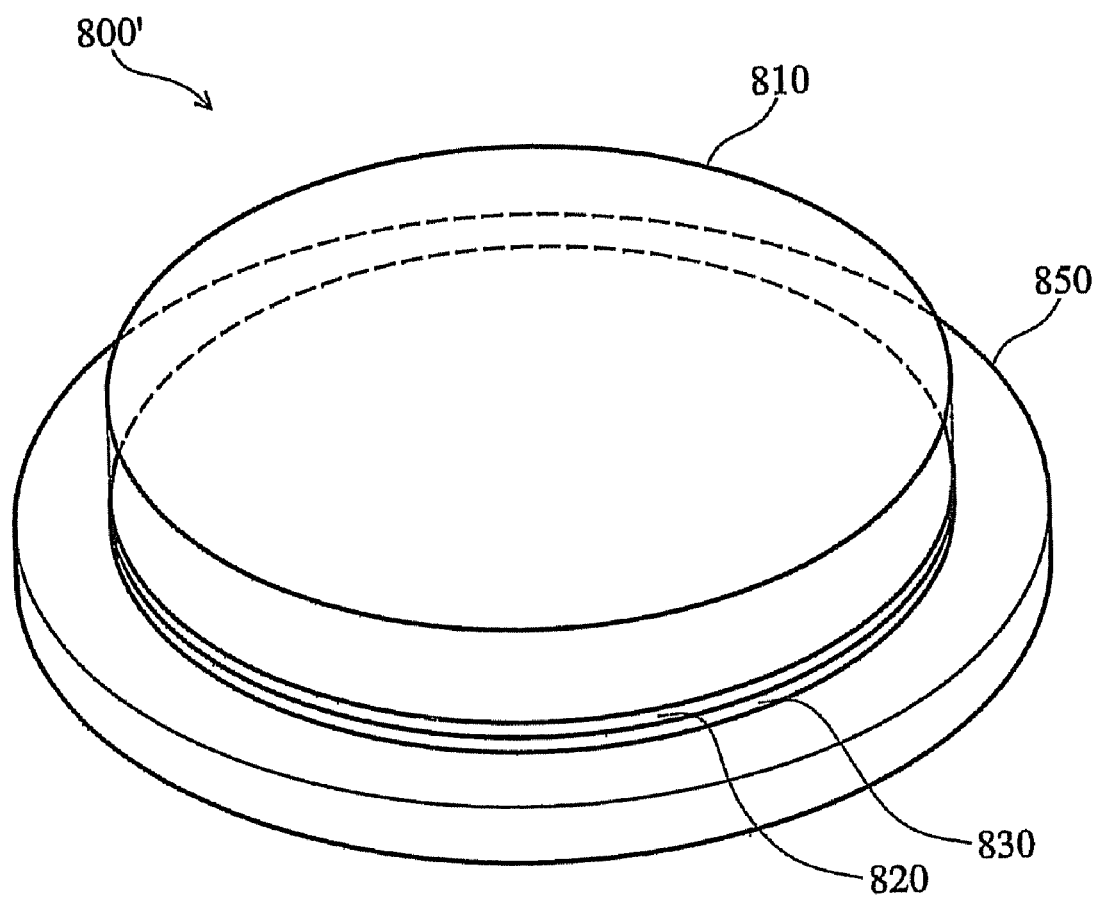
FIG. 15 is a perspective view illustrating still another exemplary embodiment of a PVD target structure.

FIG. 15 shows a perspective view illustrating still another exemplary embodiment of a PVD target structure, denoted by numeral 800'. The PVD target structure 800 is similar to the PVD target structure embodied in FIG. 14 except that it additionally comprises a target material layer 830 disposed over the detector layer 820. In the embodiment of FIG. 15, the target material layer 830 couples the PVD target structure 800' to the base plate 850.

In the embodiments of FIGS. 14 and 15, the detector layer 820 is composed of a material, which is different from the PVD target material and does not affect the PVD processing result. FIG. 16 shows a table which lists some exemplary detector layer materials that are suitable for use with respective exemplary target materials.

When plasma strikes the detector layer 820 of the PVD target structure 800 or 800' during PVD processing, the detector layer emits a vapor which may be in-situ monitored and detected by OES, RGA or other like detection methods.

The endpoint detection resolution of the PVD target structures 800 and 800' may be increased, by using two or more detector layers which are composed of different materials. Thus, when plasma strikes the first one of the detector layers, detection of that layer will indicate a first residual quantity of target material remaining and when plasma subsequently strikes a subsequent one of the detector layers, detection of that layer will indicate a subsequent residual quantity of target material remaining, which is less than the previous residual quantity. Additional layers of other materials may be added, if desired, to provide an indication of an additional residual quantity of material.

The PVD target structures may be configured and adapted to be used with or without a target base. PVD processing systems and tools may use the PVD target structures without significant hardware modifications and/or changes. Further, the PVD target structures may be used in different magnetic PVD systems including magnetron systems, capacitively coupled plasma (CCP) systems, and inductively coupled plasma (ICP) systems, to name a few. The PVD target of the invention may also be used in all types of PVD power supply systems including, without limitation, direct current power systems, alternating current power systems, and radio frequency power systems.

Figure 17A:
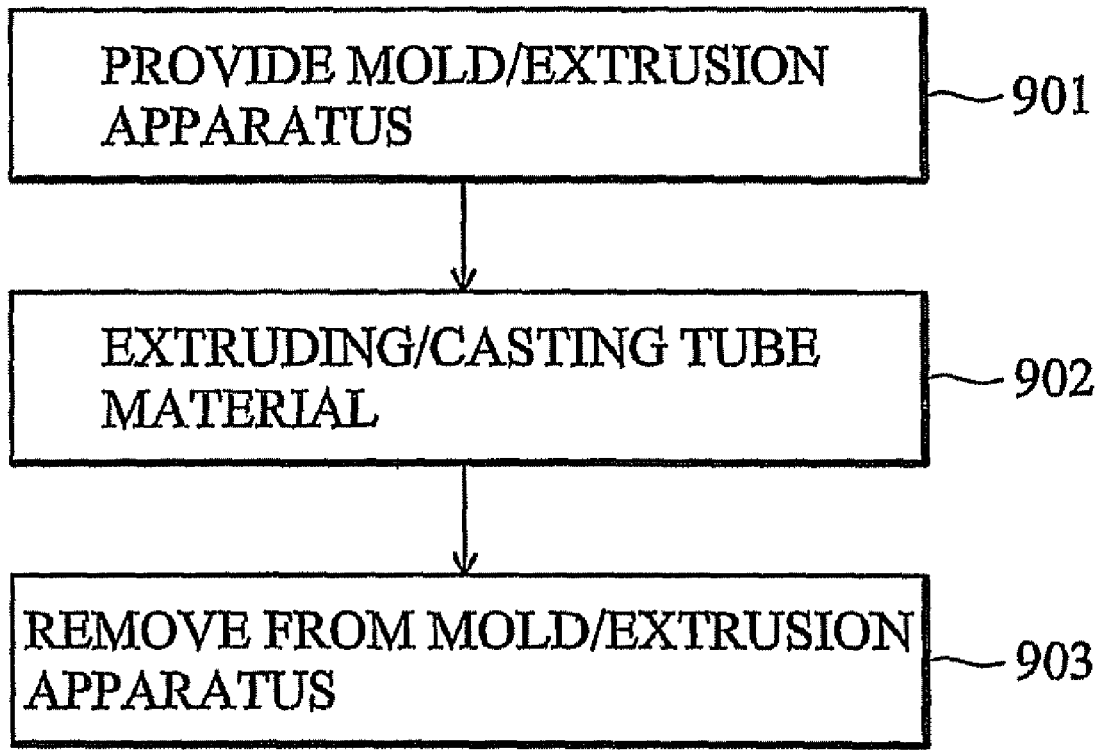
FIG. 17A is a flowchart showing the steps of a first exemplary embodiment of a tube making method.
Figure 18A:
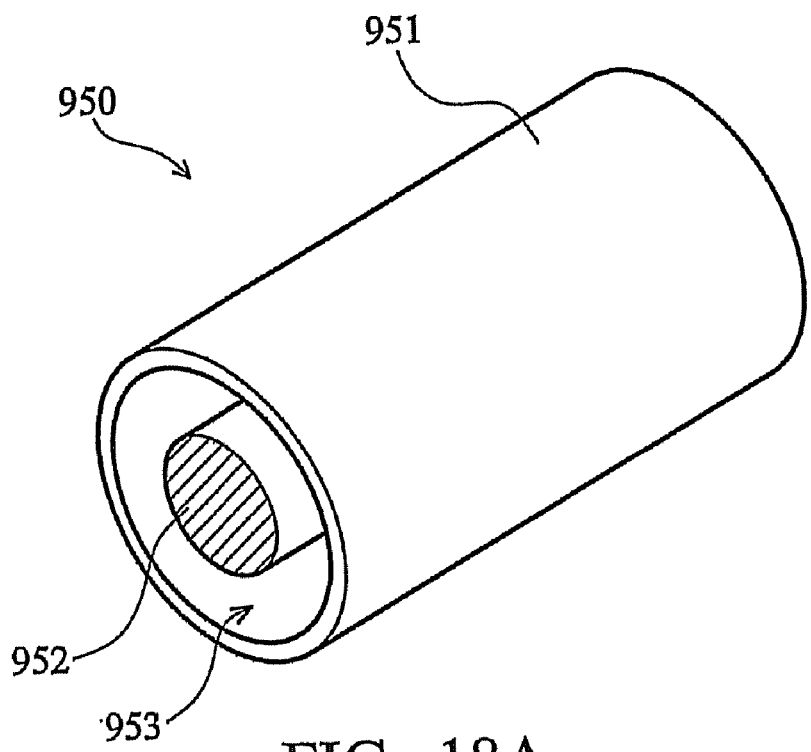
FIG. 18A is a perspective view of an exemplary embodiment of a mold/extrusion-die apparatus, which may be used in the tube making method.

Another embodiment is a method for making the tube(s) of the tube-based target structures. FIG. 17A presents a flowchart that shows the steps of a first exemplary embodiment of the tube making method. In step 901, a mold/extrusion-die apparatus 950 (FIG. 18A) is provided which comprises concentrically disposed outer and inner die members 951, 952. The outer and inner die members 951, 952 are each made of a rigid material suitable for extruding and/or casting metal, metal alloys, and/or metallic materials. Suitable die member materials may include, without limitation, ceramic materials, polymeric materials, metallic materials, and combinations thereof. The inner surface 951a of the outer member 951 of the apparatus 950 is configured to form the outer surface of the tube and the outer surface 952a of the inner member 952 of the apparatus 950 is configured to form the inner surface of the tube. In the embodiment of FIG. 18A, the outer member 951 of the apparatus 950 is configured with a circular cross-sectional shape and the inner member 952 of the apparatus 950 is configured with a circular cross-sectional shape. Such a mold/extrusion-die apparatus may be used to make the tube shown in FIG. 9A. It is contemplated, however, that the outer and inner members 951 and 952 of the apparatus 950 may be configured to make a PVD target tube of any desired shape including, for example, the tubes shown in FIGS. 9B-9F.

Referring again to the flowchart of FIG. 17A, step 902 of the method comprises extruding a desired tube material through the space 953 defined between the outer and inner members 951, 952 of the mold/extrusion-die apparatus 950. Extrusion may be performed using cold or hot extrusion methods. In an alternate embodiment, step 902 of the method comprises casting the desired tube material into the space 953 defined between the outer and inner members 951, 952 of the molding/extrusion die apparatus 950. Casting may be performed by melting the desired tube material and pouring or injecting the molten tube material into the space 953 defined between the outer and inner members 951, 952 of the apparatus 950. If the tube material is formed by casting in step 902, then step 903 is performed wherein the tube is removed from the apparatus 950 after the molten tube material has cooled and solidified.

Figure 17B:
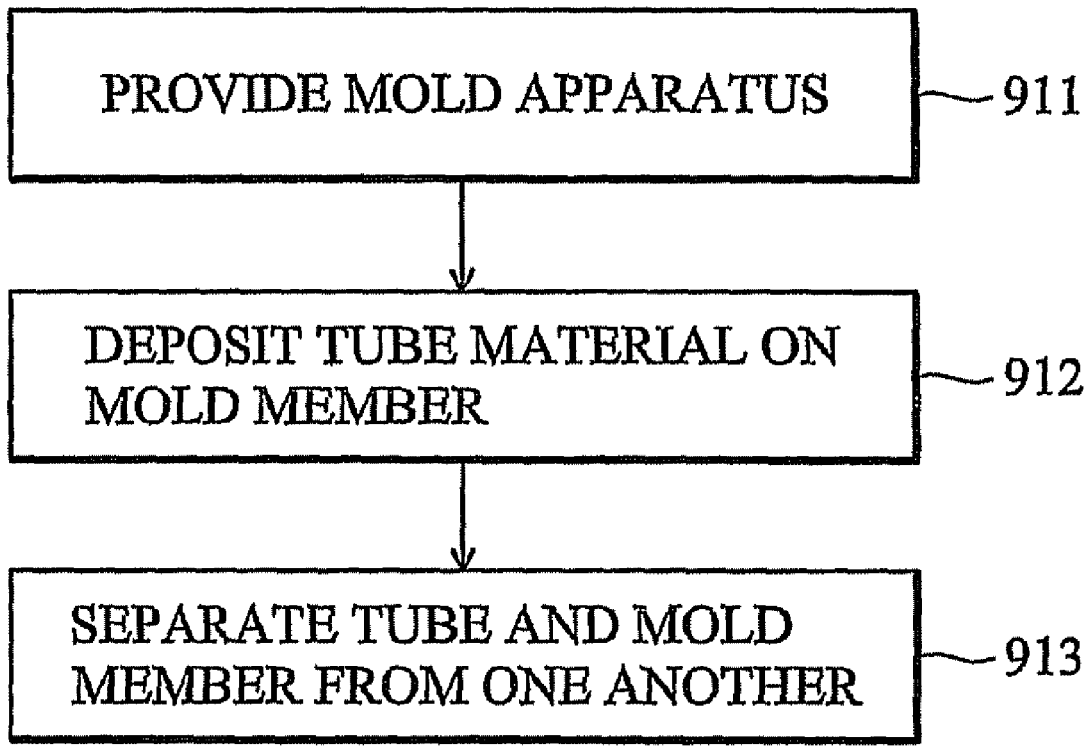
FIG. 17B is a flowchart showing the steps of a second exemplary embodiment of the tube making method.
Figure 18B:
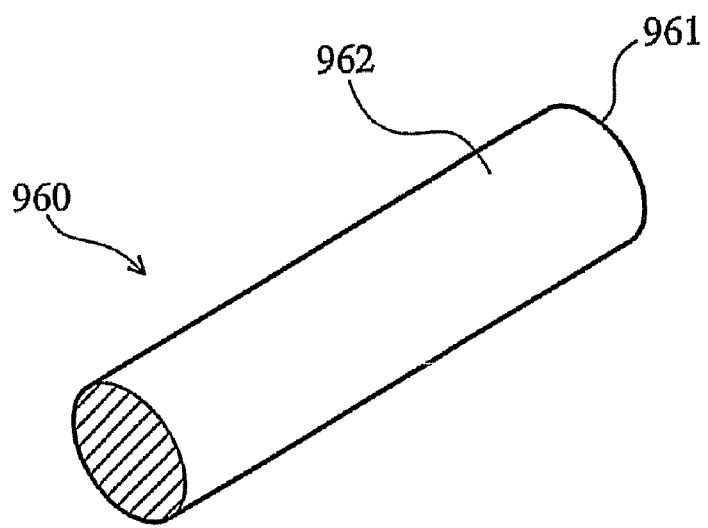
FIG. 18B is a perspective view of another exemplary embodiment of a mold apparatus, which may be used in the tube making method

FIG. 17B presents a flowchart that shows the steps of a second exemplary embodiment of the tube making method of the invention. In step 911 a mold apparatus 960 (FIG. 18B) is provided which comprises a mandrel-like mold member 961. The mold member 961 is made of a rigid material suitable for forming thereon a layer of metal, metal alloy, and/or metallic material, using PVD or electrical chemical plating. Suitable mold member materials may include, without limitation, ceramic materials, polymeric materials, metallic materials, and combinations thereof. The mold member 961 of the apparatus 960 has an outer surface 961a which is configured to form a tube having outer and inner surfaces of substantially the same shape. In the shown embodiment of FIG. 18B, the outer surface 961a of the mold member 961 is configured with a circular cross-sectional shape. Such a mold apparatus may be used to make the tube shown in FIG. 9A. It is contemplated, however, that the mold member 961 of the mold apparatus 960 may be configured to make a PVD target tube of other desired shapes including, for example, the tubes shown in FIGS. 9B and 9F.

Figure 10:
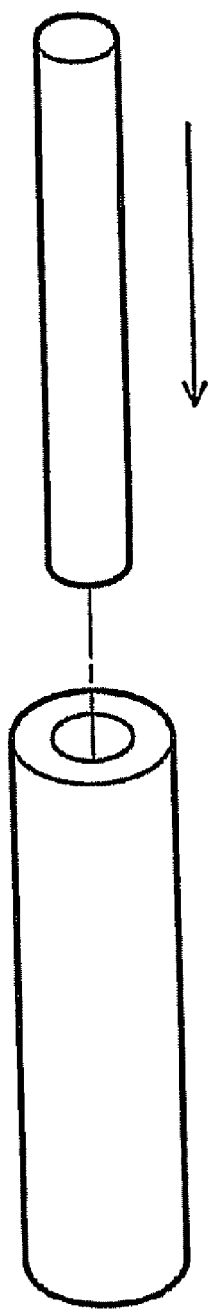
FIG. 10 is perspective view showing the removal of a mandrel-like mold member from a tube during the manufacture of same.

Referring again to the flowchart of FIG. 17B, step 912 of the method involves depositing a desired tube material onto the outer side surface 962 of the mold member 961, until a desired film thickness (wall thickness of the tube) is achieved. The depositing step may be performed using, for example, electrical chemical plating (ECP) and/or PVD methods. In step 913, the mandrel-like mold member 961 and the tube are separated from one another. In an exemplary embodiment, the separation step may be performed by physically withdrawing the mandrel-like mold member from the tube, as shown in FIG. 10. In an alternative exemplary embodiment, the separation step may be performed chemically by the mold member using an etchant.

Figure 11A:
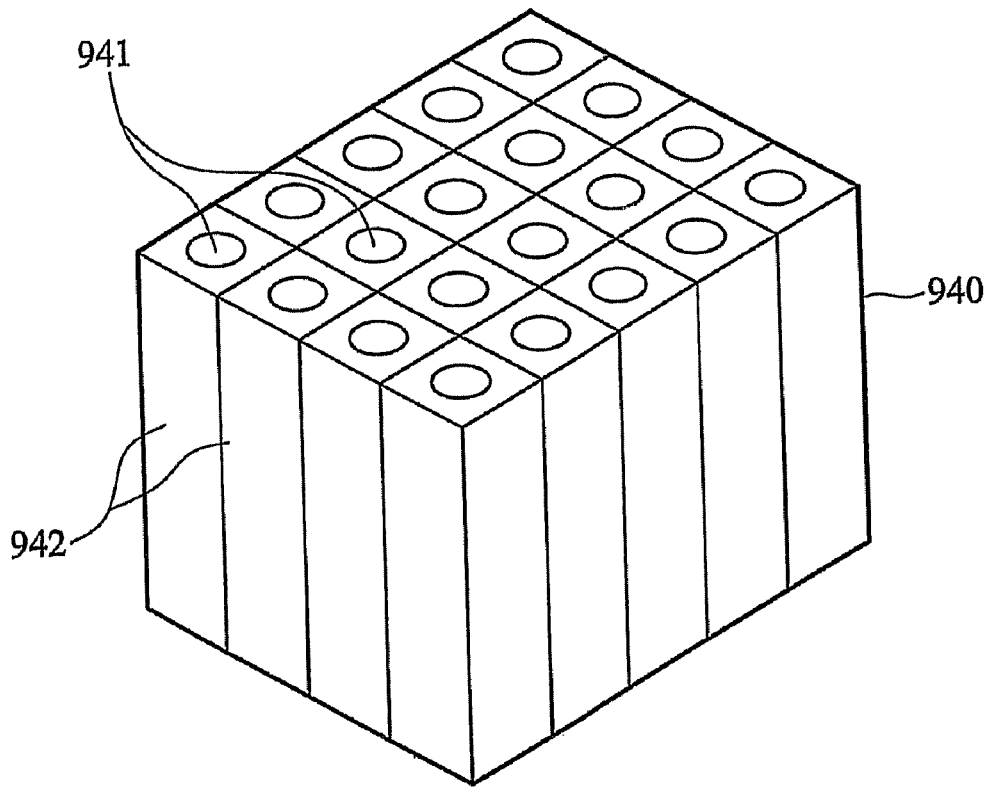
FIGS. 11A and 11B are perspective views showing an exemplary method for manufacturing the tubes of the tube-based detectors in bulk.
Figure 11B:
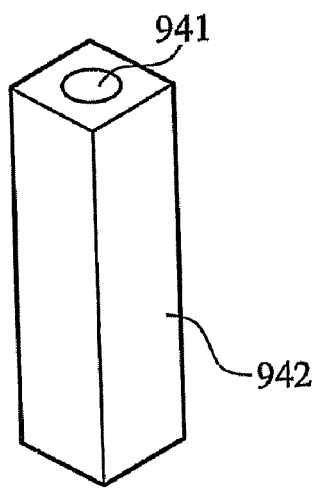
Figure 19:
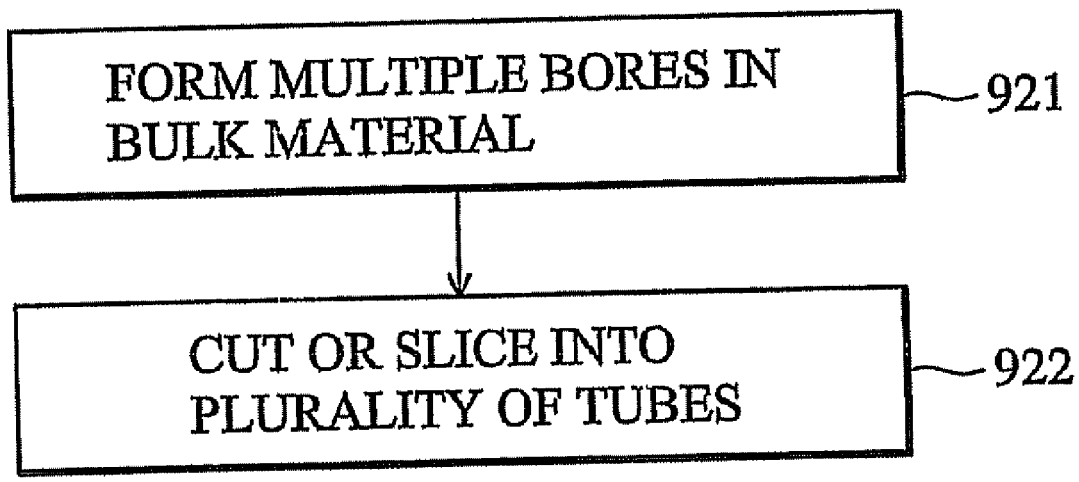
FIG. 19 is a flowchart showing the steps of a third exemplary embodiment of the tube making method.

FIG. 19 presents a flowchart that shows the steps of a third exemplary embodiment of the tube making method. In the third exemplary embodiment of the tube making method, the tube is made in a bulk manufacturing process. In step 921, multiple bores 941 are formed in a bulk quantity of a desired tube material 940 as shown in FIG. 11A. The multiple bores 941 define the inner surfaces of a plurality of tubes. In step 922, the bulk quantity of material is cut or sliced into a plurality of discrete tubes 942 as shown in FIG. 11B, each of the tubes 942 comprising one of the bores 941. The bores 941 may be formed using conventional laser, high-pressure water, wet etching, and dry etching methods. The bulk material 940 may be cut or sliced into the plurality of discrete tubes using conventional laser, high-pressure water, and mechanical cutting methods.

Figure 12A:
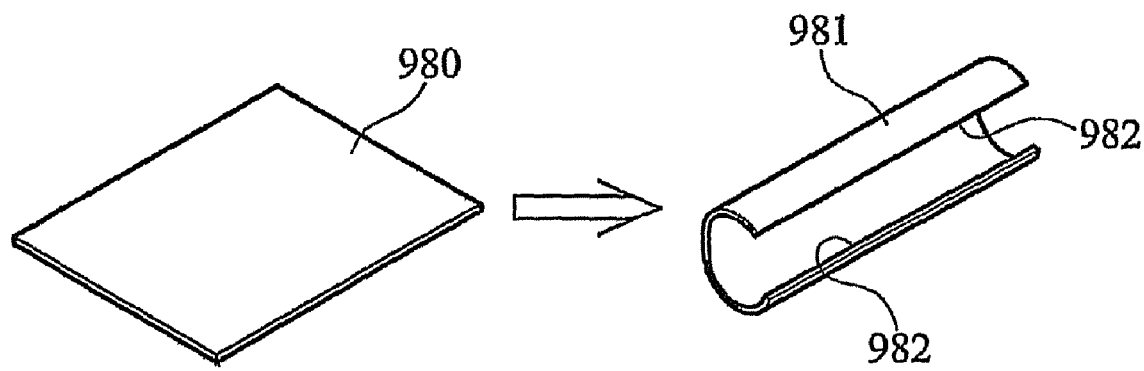
FIGS. 12A, 12B, 13A and 13B are perspective view showing the tubes of the tube-based detectors manufactured using an exemplary sheet forming method.
Figure 12B:
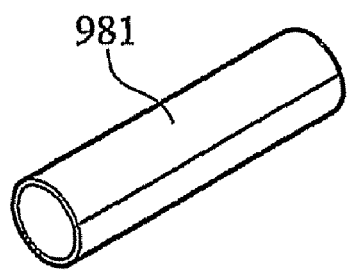
Figure 13A:
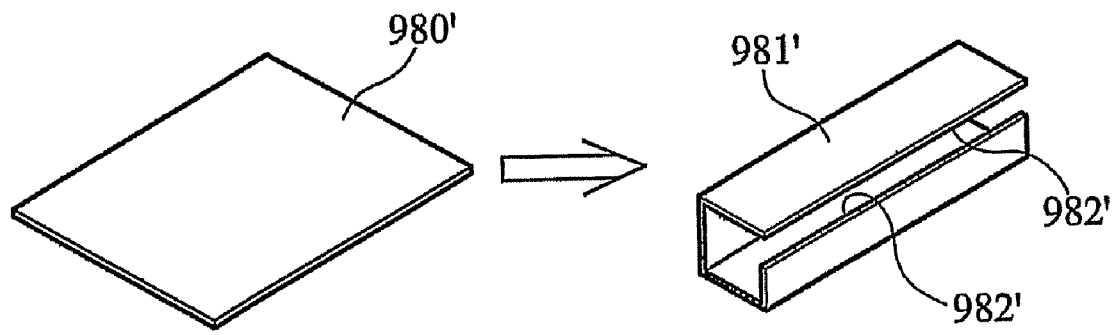
Figure 13B:
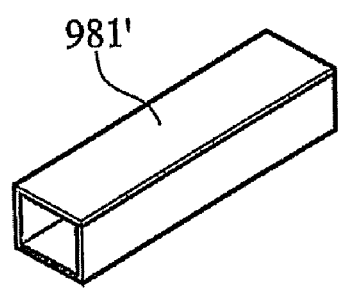
Figure 20:
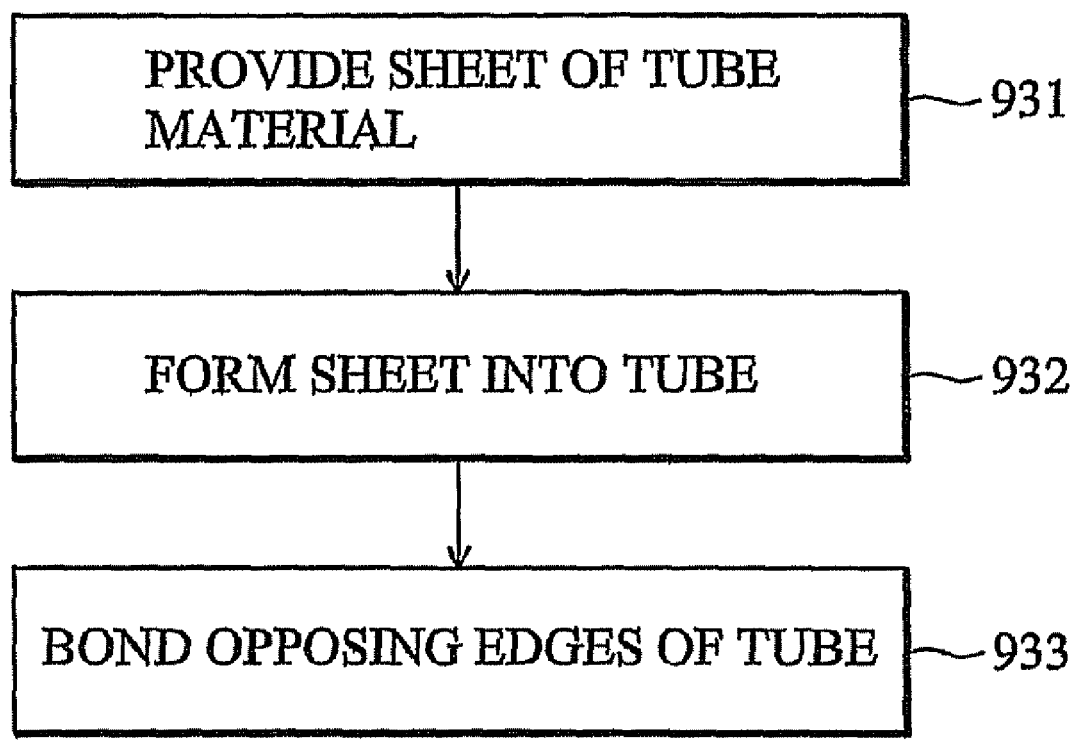
FIG. 20 is a flowchart showing the steps of a fourth exemplary embodiment of the tube making method.

FIG. 20 is a flowchart that shows the steps of a fourth exemplary embodiment of the tube making method. In step 931, a malleable sheet 980, 980' of the desired tube material is provided, and in step 932, the sheet 980 is formed into a tube 981, 981' of a desired shape, as shown in FIGS. 12A and 13A. The sheet 980, 980' may be formed into the desired tube shape in step 932 by forming it around a correspondingly shaped mandrel similar to that shown in FIG. 18B. The matching, opposing edges 982, 982' of the tube 981, 981' are then bonded to one another in step 933 to complete the tube 981, 981' as shown in FIGS. 12B and 13B. Bonding may be accomplished using any suitable and appropriate bonding method, such as welding.

Another embodiment of the invention is a system for detecting the service lifetime endpoint of a PVD target structure. FIG. 5 is an embodiment of such a system, denoted by numeral 300. The system 300 comprises a PVD process chamber 310, a PVD target structure 320 such as shown in FIG. 2A, 2B or 3, disposed in the process chamber 310 and a monitoring device 330 connected to the PVD target structure 320 for in-situ monitoring the characteristic or attribute of the filament or electrode detector assembly 340 of the PVD target structure 320.

FIG. 6 is another embodiment of a system for detecting the service lifetime endpoint of a PVD target, denoted by numeral 400. The system 400 comprises a PVD process chamber 410, a PVD target structure 420, such as shown in FIGS. 4, 14, or 15, disposed in the process chamber 410 and a gas detection device 430 for in-situ monitoring and detecting the inert gas detector or detector layer 440 of the PVD target structure 420.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of forming a physical vapor deposition target comprising the steps of:
   providing a bulk material;
   forming a plurality of bores in the bulk material;
   separating the bulk material into a plurality of discrete units each comprising one of the bores; and
   at least partially embedding at least one of the units in a slab of consumable material,
   wherein each of the units forms an enclosure of a detector, the detector for signaling that the slab of consumable material is approaching or has been reduced to a predetermined quantity of the consumable material and wherein the bulk material and the slab of consumable material are made of the same material.

2. The method of claim 1 wherein the slab of consumable material comprises a physical vapor deposition target.

3. The method according to claim 1, further comprising the step of providing a signaling element in the at least one enclosure to form the detector.

4. The method according to claim 3, wherein the signaling element comprises one of a filament element and electrode elements.

5. The method according to claim 3, wherein the signaling element comprises one of a gas material, a liquid material, and a solid material different from the consumable material from which the slab is formed.

6. The method according to claim 3, wherein the signaling element providing step is performed before the embedding step.

7. The method according to claim 1, wherein the forming step comprises a drilling method.

8. The method according to claim 7, wherein the drilling method is performed by a laser, high pressure water, wet etching, dry etching or a combination thereof.

9. The method according to claim 1, wherein the separating step comprises a cutting step.

10. The method according to claim 9, wherein the cutting step is performed by a laser, high pressure water, mechanical cutting, or a combination thereof.

11. The method according to claim 1, wherein the enclosure of the detector comprises a tube having opposing open ends, and wherein the detector further comprises a filament and isolators closing the opposing open ends of the tube and suspending the filament within the tube.

12. The method according to claim 11, wherein the filament includes bent marginal end portions which extend through the isolators, the isolators electrically isolating the bent marginal end portions of the filament from the tube.

* * * * *